United States Patent [19]

Schmidt

[11] 4,017,821

[45] Apr. 12, 1977

[54] CIRCUIT ASSEMBLY AS FOR A T-ELEMENT

[75] Inventor: Gerhard Schmidt, Emmering, Germany

[73] Assignee: Siemens Aktiengesellschaft, Berlin & Munich, Germany

[22] Filed: Dec. 1, 1975

[21] Appl. No.: 636,428

[30] Foreign Application Priority Data

Dec. 6, 1974 Germany .......................... 2457868

[52] U.S. Cl. ................................ 338/95; 338/295; 338/308; 361/403
[51] Int. Cl.² ........................................ H01C 10/06
[58] Field of Search ....... 317/101 R, 101 C, 101 A; 339/92, 95, 97, 125, 126, 288, 295, 322, 307, 308

[56] References Cited

UNITED STATES PATENTS

| | | | |
|---|---|---|---|
| 1,932,650 | 10/1933 | Weiscopf | 338/295 |
| 2,452,307 | 10/1948 | Koehl | 338/95 |
| 3,417,193 | 12/1968 | Cole | 338/222 |

Primary Examiner—David Smith, Jr.
Attorney, Agent, or Firm—Hill, Gross, Simpson, Van Santen, Steadman, Chiara & Simpson

[57] ABSTRACT

A circuit assembly as for an attenuation circuit is constructed upon a glass or ceramic substrate. T-element attenuators are formed on one face of the substrate by a film-circuit technique. Connections to electrodes of the T-element resistances are made by contact elements having clamping portions which engage an edge of the substrate to overlie the respective electrodes. One side of each contact element is extended from the clamping portion to form a contact arm having a forked end spaced adjacent the face of the substrate. The electrodes and contact elements are spaced apart longitudinally of the substrate and the contact arms alternate longitudinally between front and back faces thereof. Wire bridge connections are then readily made between successive arms on one or the other side of the substrate to turn on or off the individual T-element attenuator. Further, a connecting rod extends from each contact element normally to the edge of the substrate and parallel to the face of the substrate to engage a bore in a carrier plate upon assembly. Such rods connect to cross-pieces to facilitate assembly onto the substrate, one cross-piece for each set of contact elements having connecting arms on one side of the substrate.

6 Claims, 1 Drawing Figure

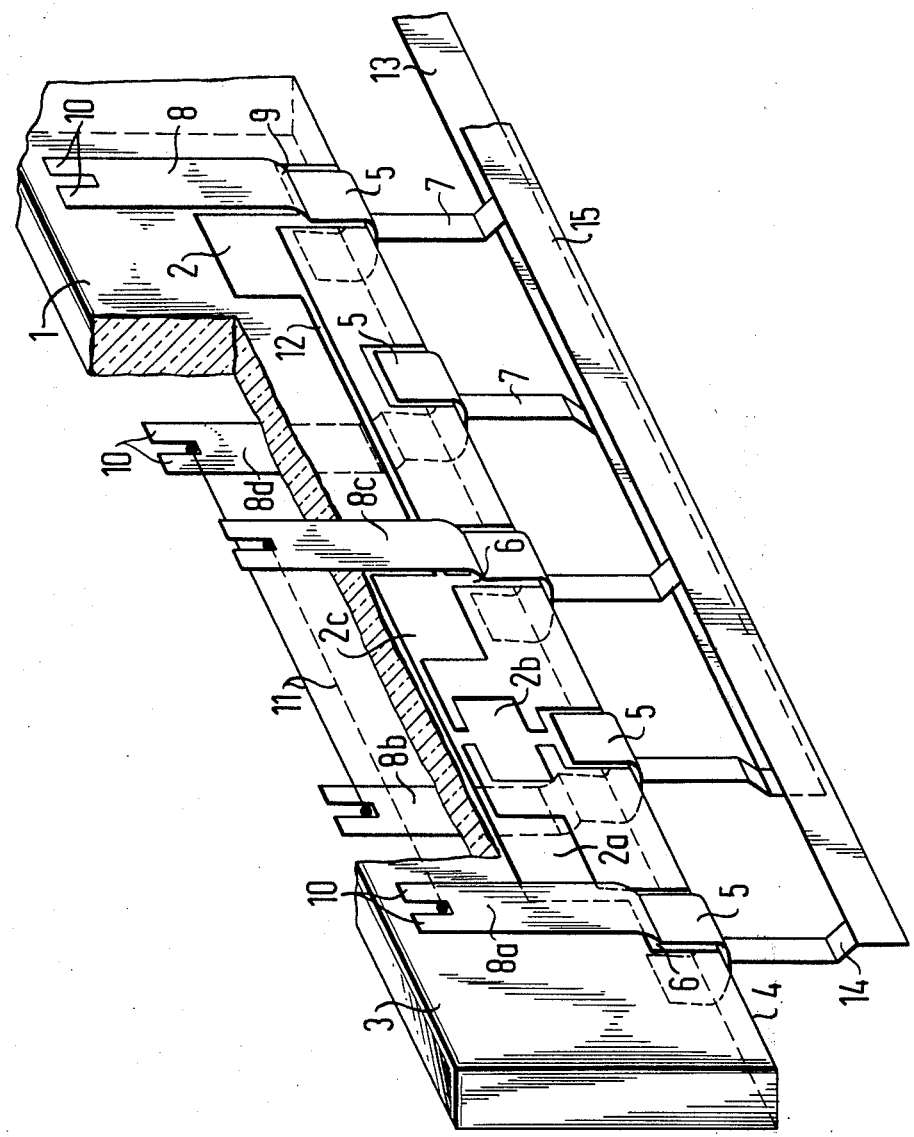

CIRCUIT ASSEMBLY AS FOR A T-ELEMENT

BACKGROUND OF THE INVENTION

1. Field of the Invention

The invention relates to a circuit assembly useful in attenuation element circuitry.

2. The Prior Art

A circuit assembly is known, for example, from the German Utility Pat. No. 7,404,505, in which connecting rods of contact elements are connected to an elongate substrate. Such rods extend parallel to the large surfaces of the substrate so that with the aid of the contact elements positioned on one edge of the substrate it is possible to connect the substrate to a carrier plate at right angles to the direction of said carrier plate by inserting the connecting rods into bores in the carrier plate. A particularly compact arrangement of such substrates on a carrier plate can be achieved.

Owing to the increasing miniaturisation of the components of the electro-technique, attenuation elements employed, for example, in communications technology for purposes of level matching are also being constructed with optionally adjustable attenuation values, employing ceramic or glass substrates covered by resistance layers applied by the film circuit technique. In this respect, the problem is encountered of interconnecting the individual resistance layers in a simple fashion to achieve a desired attenuation value. In the case of an attenuation element known from the German AS 2 113 490, the individual resistance layers are switched on and off with the aid of switching devices in the form of rotary switches which cooperate with metal strips which in turn contact the individual resistance layers of a ceramic substrate. The movement of slide contacts directly above contact paths arranged on the substrate cannot be allowed generally because of the rapid wear of such slide contacts caused by the substrate material.

SUMMARY OF THE INVENTION

A circuit assembly comprises a substantially rectangular ceramic or glass substrate having circuit elements which are applied to at least one of its large surfaces by the film circuit technique. A plurality of longitudinally spaced-apart, clamp-like contact elements include mutually opposite, spaced-apart clamping flanks embracing one edge of the substrate. The contact elements electrically contact the film circuit and mechanically connect the substrate to a carrier plate. At least one of the flanks of each contact element is extended beyond the region of the clamping contour of said contact element to form a contact arm which extends parallel to the substrate and spaced therefrom. The free ends of the contact arms receive at least one wire bridge extending between adjacent contact arms from fork fingers thereon. In a further development of the invention only one of the flanks of each contact element is extended to form the contact arm, and the contact elements are arranged on the substrate edge with the contact arms alternately on one side and the other side of the substrate.

BRIEF DESCRIPTION OF THE DRAWING

The single drawing FIGURE shows an enlarged, perspective and schematic view of a circuit asembly, partially in section, according to the invention.

DESCRIPTION OF THE PREFERRED EMBODIMENT

The device comprises a glass or ceramic substrate 3 of generally rectangular configuration. On one of the large surfaces of the substrate 3 resistance layers 2 are applied by the film circuit technique. Arranged on a longitudinally extending edge surface 4 of the substrate 3 are a plurality of clamp-like contact elements 5 which comprise two mutually opposite spaced-apart clamping flanks arranged to grip respective side portions of the ceramic substrate adjacent the edge surface 4. The contact elements 5 are spaced apart by approximately 2.5 mm along the substrate at intervals which correspond to the spacing of bores arranged in a carrier plate, not shown. Connecting electrodes 6, which are arranged in the side portions contacted by the flanks and which form part of the resistance layers 2, are thus contacted by the contact elements 5, which contact elements are attached to the substrate 3 as by soldering at least one of the flanks to respective connecting electrodes 6. Each contact element 5 has a connecting rod 7 which projects from its contact element in the plane of symmetry of a clamping contour and which can be directly inserted into a respective bore of the aforementioned carrier plate (not shown) and soldered to conductor paths arranged thereon.

One of the flanks of each contact element 5 is extended to form a contact arm 8. An angled portion 9 spaces the arm 8 a determinate distance outwardly from the substrate surface and in parallel thereto. Free ends 10 of the contact arms 8 are fork-shaped. The contact elements 5 are arranged on the substrate in such manner that the contact arms 8 of respective contact elements 5 are located on alternate sides of the substrate 3. Arranged in the forked ends of adjacent arms 8 on respective sides of the substrate 3 are wire bridges 11 the length of which is approximately 5mm, said bridges being held in place in the forked ends of the arms 8 as by soldering.

With the aid of conductive connection paths 12 provided on the substrate, the resistance layers 2 are interconnected in such manner that the resistance layers 2a and 2c form the series resistances of a T-element, and the resistance layer 2b connected to the connection point of the latter forms the shunt resistance of a T-element. In addition, one of these connection paths connects the resistance layer 2c to another resistance layer 2 of a neighbouring T-element arranged on the substrate 3, so that the series resistances of all the T-elements arranged on the substrate 3 are connected in series. The free ends of the resistances 2a, 2b and 2c of each T-element are each connected to connecting electrodes 6 which are connected to the contact arms 8a, 8b and 8c. Also each T-element is assigned a fourth contact element 5, which is placed in insulated fashion on the substrate 3 and which is provided with a contact arm 8d. The fourth contact elements 5, with the contact arms 8d, of all the T-elements arranged on the substrate 3, are connected to one another for example by a conductor path of a carrier plate (not shown) and form a common terminal both of the input and of the output of a four-terminal attenuation device. The other terminal of the input of this attenuation four-terminal device is connected to the contact element 5 of the contact arm 8a and the other terminal of the output is formed by a contact element (not shown) which is arranged at the other end of the substrate and which corresponds to the contact element 5 of the contact arm 8c.

The insertion of a wire bridge 11 between the contact arms 8a and 8c therefore results in the short-circuiting of the resistances formed by the resistance layers 2a and 2c, and thus in the bridging of the T-element with the layers 2a, 2b and 2c, whereas the insertion of a wire bridge between the contact arms 8b and 8d cause the base of this T-element to be connected to the one terminal of the attenuation four-terminal device. Consequently, in each T-element of the substrate 3, either the contact arms 8a and 8c on the one side of the substrate or the contact arms 8b and 8d on the other side of the substrate must be connected to one another. In the former case the relevant T-element is switched off, whereas in the second case it is switched on.

As can also be seen from the FIGURE, individual connecting rods 7 of the contact elements 5 which have contact arms 8 on the same front side of the substrate 3 are commonly connected for assembly to a crosspiece 15 which serves to connect these connecting rods 7, whereas the connecting rods 7 of the other contact elements 5 are connected to a crosspiece 13. The crosspieces 15, 13 advantageously enable a plurality of contact elements 5 to be commonly arranged on one edge surface of the substrate 3.

With the aid of angled portions 14 disposed between the connecting rods 7 and the crosspieces 15, 13, the crosspieces are offset in relation to the plane of the connecting rods 7 in such manner that the contact elements 5 connected to a crosspiece can be placed on the substrate with the contact arms 8 on one side of the substrate 3, whereupon by rotating one crosspiece by 180°, contact elements 5 with contact arms 8 can be placed on the other side of the substrate 3 without the crosspieces 15, 13 obstructing one another. This is of importance since the crosspiece 15, 13, together with the angled portions 14 of the connecting rods are separated from the connecting rods 7 only after the contact elements 5 have been soldered to their assigned connecting electrodes 6 of the substrate 3. During the soldering process, which is usually an automated step, the crosspieces ensure that the contact elements 5 cannot move from their proper locations on the substrate.

With the aid of a connecting and support device designed in accordance with the invention, an extremely compact arrangement of attenuation elements is provided by which attenuation resistances can easily be switched on and off.

With a suitable arrangement and contacting of the resistance layers provided on the substrate, as shown and described, the connection of in each case two adjacent contact arms on the one side of the substrate 3 can be used for switching on an attenuation element and the two adjacent arms on the other side of the substrate can be used to short-circuit and thus switch off the attenuation element. Thus the relevant switching state of the attenuation element can be immediately established. With spacing of approximately 2.5 mm between adjacent connecting rods 7, nevertheless there is obtained the relatively large distance of 5 mm between the adjacent contact arms 8 on each side of the substrate. Such spacing substantially simplifies the wiring of these contact arms with wiring bridges. Furthermore, with the aid of the angled portions 14 provided on the connecting rods 7, it is possible to connect the contact elements 5 with contact arms 8 all on one side of the substrate 3 by means of a transverse strip 15 or 13 which serves to connect the connecting rods 7 of the contact elements, for assembly of the contact elements to the substrate, since the angled portions 14 of the connecting rods 7 cause this transverse strip 15 or 13 to be offset in relation to the transverse strips of the other contact elements, and thus the transverse strips cannot mutually obstruct one another.

Although various minor modifications might be suggested by those versed in the art, should be understood that I wish to embody within the scope of the patent warranted hereon all such modifications as recently and properly come within the scope of my contribution to the art.

I claim as my invention:

1. A circuit assembly comprising a substantially rectangular substrate having circuit elements which are applied by the film circuit technique to at least one of its large surfaces, and a plurality of longitudinally spaced-apart, clamp-like contact elements each having clamping flanks which embrace an edge of said substrate, said contact elements forming electric connections to the circuit elements and affording mechanical connections of the substrate to a carrier plate, wherein:

at least one of the flanks of each contact element is extended to form a contact arm which extends in spaced, parallel relation to the substrate to a free end; and fork means provided on the free ends of the contact arms receive in electrical contact at least one wire bridge extending between two of said contact arms.

2. An assembly as defined in claim 1, wherein only one of the flanks of each of the contact elements is extended to form a contact arm, and wherein the contact arms are arranged alternately on one side and then the other side of the substrate, longitudinally therealong.

3. An assembly as defined in claim 1, wherein each contact element has a connecting rod extending therefrom in the plane of the substrate, for insertion into bores in a carrier plate upon which the assembly is to be mounted.

4. An assembly as defined in claim 1, wherein four of such contact elements comprise an attenuation element, first and third of said contact elements being joined to series resistances of a T-element and the contact arms being on a front side of said substrate, a second such contact element being jointed to a shunt resistance thereof, and a fourth such contact element being connected to a common input-output terminal of an attenuator device, said second and fourth elements each having a contact arm on a rear side of said substrate, whereby selectively inserting said wire bridge between said first and third elements short circuits the attenuation element and inserting said wire bridge between said second and fourth elements turns on the attenuation element.

5. A circuit assembly comprising a substrate having a longitudinal edge and a face on which a plurality of circuit elements are formed by a film technique, at least some of said circuit elements having electrodes near said edge and spaced apart longitudinally thereof, and a plurality of contact elements having a clamping portion for receiving said edge of said substrate and for electrically contacting a respective one of said electrodes, wherein:

each of said contact elements has a single contact arm extending from its said clamping portion in spaced parallel relation to said face of said substrate and normally to said edge;

each said contact arm has a free end opposite said clamping portion for selectively receiving a wire bridge; and each said contact element has a connecting rod extending from a central part of its clamping portion normally to said edge and parallel to said face of said substrate, said rods being receivable in a carrier plate.

6. A circuit assembly as defined in claim 5, wherein said substrate has a second face parallel to said first-mentioned face in said contact arms are spaced longitudinally alternatively to overlie said first and second faces of said substrate.

* * * * *